US006469534B1

(12) United States Patent
Kimura

(10) Patent No.: US 6,469,534 B1
(45) Date of Patent: Oct. 22, 2002

(54) SEMICONDUCTOR INTEGRATED CIRCUIT APPARATUS AND ELECTRONIC DEVICE

(75) Inventor: Takashi Kimura, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 9 days.

(21) Appl. No.: 09/635,862

(22) Filed: Aug. 11, 2000

(30) Foreign Application Priority Data

Aug. 19, 1999 (JP) .......................................... 11-232433

(51) Int. Cl.[7] ........................ G01R 31/02; G01R 31/26; G01R 31/28

(52) U.S. Cl. ....................... 324/763; 324/765; 714/733; 714/734

(58) Field of Search ................................ 324/763, 765; 714/733, 734, 742

(56) References Cited

U.S. PATENT DOCUMENTS 4,707,654 A * 11/1987 Suzuki et al. ............... 324/763
5,442,643 A * 8/1995 Adachi ....................... 714/733
6,313,657 B1 * 11/2001 Hashimoto .................. 324/763

* cited by examiner

*Primary Examiner*—N. Le
*Assistant Examiner*—Anjan K. Deb
(74) *Attorney, Agent, or Firm*—Oliff & Berridge, PLC

(57) ABSTRACT

Provided is a semiconductor integrated circuit device, an electronic instrument and a method of testing a semiconductor integrated circuit device which simplifies a test circuit and can decrease test loads such as the preparation of a test vector and test time when a plurality of single chips are integrated on one chip. The semiconductor integrated device comprises a first semiconductor integrated circuit, a second semiconductor integrated circuit, and an I/O circuit connected to an external terminal. The I/O circuit receives an internal signal, which is output from the first semiconductor integrated circuit to the second semiconductor integrated circuit, and outputs the internal signal to outside through the external terminal and to the second semiconductor integrated circuit as the input thereof. The I/O circuit comprises a first buffer which controls the output of the internal signal. The I/O circuit makes the first buffer conductive when the output of the first semiconductor integrated circuit is tested and makes the first buffer nonconductive when the input of the semiconductor integrated circuit is tested. An I/O circuit having a current characteristic-measuring function may be used.

4 Claims, 12 Drawing Sheets

| | TS | E | A | TE | TA | PAD | |
|---|---|---|---|---|---|---|---|
| 530 | 0 | 1 | X | X | X | HZ | |
| | 0 | 0 | 0 | X | X | 0 | |
| | 0 | 0 | 1 | X | X | 1 | |
| 540 | 1 | X | X | 1 | X | HZ | 542 |
| | 1 | X | X | 0 | 0 | 0 | 544 |
| | 1 | X | X | 0 | 1 | 1 | 546 |

X: DON'T CARE

| TYPES OF TEST \ TERMINAL | | INTERNAL SIGNAL OF TEST SIGNAL GENERATION | | | | | TERMINAL OF BUFFER WITH A TEST FUNCTION | | | | | | | | | | | | |
|---|---|---|---|---|---|---|---|---|---|---|---|---|---|---|---|---|---|---|---|
| | | | | | | | CONNECTED TO CPU(532−2) | | | | | | CONNECTED TO ASIC(532−1) | | | | | | |
| | | CPU TEST | ASIC TEST | TEST 2 | TEST 0 | TEST 1 | TS | E | A | TE | TA | PAD | TS | E | A | TE | TA | PAD | |
| DC TEST | H LEVEL OUTPUT CURRENT | 0 | 0 | 1 | 1 | 0 | 1 | X | X | 0 | 1 | 1 | 1 | X | X | 0 | 1 | 1 | 710 |
| DC TEST | L LEVEL OUTPUT CURRENT | 0 | 0 | 1 | 0 | 0 | 1 | X | X | 0 | 0 | 0 | 1 | X | X | 0 | 0 | 0 | 720 |
| DC TEST | LEAK CURRENT | 0 | 0 | 1 | X | 1 | 1 | X | X | 1 | X | HZ | 1 | X | X | 1 | X | HZ | 730 |
| TEST OF CPU | | 1 | 0 | 0 | X | X | 0 | BE | BO | X | X | * | 1 | X | X | 1 | X | HZ | 740 |
| TEST OF ASIC | | 0 | 1 | 0 | X | X | 1 | X | X | 1 | X | HZ | 0 | AE | AO | X | X | ** | 750 |
| DURING NORMAL OPERATION | | 0 | 0 | 0 | X | X | 0 | BE | BO | X | X | * | 0 | AE | AO | X | X | ** | 760 |

* BE=1 PAD=HZ
BE=0 { BO=0 → PAD=0 ; BO=1 → PAD=1

** AE=1 PAD=HZ
AE=0 { AO=0 → PAD=0 ; AO=1 → PAD=1

SEMICONDUCTOR INTEGRATED CIRCUIT APPARATUS AND ELECTRONIC DEVICE

BACKGROUND OF THE INVENTION

1. Field of the Invention

The present invention relates to a semiconductor integrated circuit device, an electronic instrument containing a semiconductor integrated circuit device, and a method of testing a semiconductor integrated circuit device.

2. Description of Related Art

A built-in system of electronic instruments, e.g., portable information devices and multimedia terminals must be provided with a CPU, an LCD controller and devices having various interface functions such as a PCMCIA, a compact flash, a key board/mouse, and ISA bus subset as companion functions.

In such a built-in system, each chip having a necessary function of the aforementioned CPU and LCD controller and having a companion function and the like is sometimes integrated on one chip as an SOC (system on chip) to improve cost-efficiency.

FIG. 1 is a view for explaining measures for making an interface between two chips, A and B in an SOC (system on chip).

As shown in the figure, the interface between an A chip 10 and a B chip 20 is made by a terminal multiplexer using a selector 30 or the like. An internal signal output from the A chip 10 is input to the B chip 20 via the selector 30 (see 60 in FIG. 1).

When a plurality of chips is integrated on one chip by using the selector 30 in this manner, in addition to a simple test for each of the A chip and the B chip, a connection test between each chip in the plurality of chips is also required.

Specifically, in FIG. 1, a test is required for each of a line 40 and a line 50 as a simple test for each of the A chip and the B chip and, in addition, it is necessary to test for a line 60 as a connection test between chips. This poses the problem that an extra connection test is required in this manner, causing an increase in testing time.

Also, there exists a problem that if the internal structure of each chip is insufficiently understood, it is difficult to prepare a test vector and to test the test vector when the connection test is made.

In recent years, in particular, there has been a strong request to integrate a plurality of chips developed by different manufacturers on one chip to form an SOC (system on chip). In such a case, it is difficult to prepare a test vector considering the structures of the chips developed by other manufacturers. It is therefore desired to develop a semiconductor integrated circuit device having a structure which can ensure the operation of an SOC (system on chip) by a test for each single chip only.

SUMMARY OF THE INVENTION

The present invention has been made in view of the foregoing technical problems, and it is an objective of the present invention to provide a semiconductor integrated circuit device, an electronic instrument and a method of testing a semiconductor device which simplifies a test circuit and can decrease test loads such as the preparation of a test vector and test time when a plurality of single chips is integrated on one chip.

(1) The present invention provides a semiconductor integrated circuit device comprising:

a first semiconductor integrated circuit;

a second semiconductor integrated circuit; and an I/O circuit connected to an external terminal, wherein the I/O circuit receives an internal signal, which is sent from the first semiconductor integrated circuit to the second semiconductor integrated circuit, and outputs the internal signal to outside through the external terminal and also as an input to the second semiconductor integrated circuit.

For instance, a structure may be such as an internal input terminal of the I/O circuit is connected to the output of the first semiconductor integrated circuit, an internal output terminal of the I/O circuit is connected to the input of the second semiconductor integrated circuit, the I/O circuit receives the output of the first semiconductor integrated circuit through the internal input terminal and outputs to outside through the external terminal and also provides the input to the second semiconductor integrated circuit through the internal output terminal.

The present invention ensures that only an I/O circuit and an aluminum wiring suffice for the connection between chips when a plurality of semiconductor integrated circuits is integrated on one chip. This eliminates a connection test between chips which is required when these chips are connected by a selector or the like, which can greatly decrease test loads such as test time and the formation of a test vector.

In recent years, there has been a strong request to integrate a plurality of chips developed by different manufacturers on one chip to form an SOC (system on chip). In such a case, it is difficult to prepare a test vector considering the structures of the chips developed by other manufacturers. The present invention ensures an operation by only a test for each single semiconductor integrated circuit and is therefore particularly effective when separately developed semiconductor integrated circuits are integrated on one chip.

(2) The I/O circuit of the present invention may comprise:

a first buffer to which the internal signal is input; and a second buffer connected to a signal line which connects an output of the first buffer to the external terminal, the first buffer many include an enable terminal, and a conductive state and a nonconductive state of the first buffer may be controlled according to an enable signal received by the enable terminal, and the second buffer may receive at least one of the internal signal and an input signal from the external terminal and may output the internal signal or the input signal as an input to the second semiconductor integrated circuit.

When the enable signal is active, the state of the first buffer can be conductive and when the enable signal is inactive, the state of the first buffer can be nonconductive.

When the first buffer is conductive, the internal signal output from the first buffer is preferably output to outside through the external terminal and to the second semiconductor integrated circuit as the input thereof. Also, when the first buffer is in the nonconductive state, the external signal input from the external terminal is preferably output as the input to the second semiconductor integrated circuit.

According to the present invention, the input to the second semiconductor integrated circuit is switched from the internal signal to the external signal and vice versa by using such simple configuration as only controlling the state of the first buffer between conductive and nonconductive. It is therefore unnecessary to provide a input circuit for testing or the like particularly. The internal signal can be input in a normal operation and a test signal can be input from outside when the second semiconductor integrated circuit is tested. For this reason, it is unnecessary to test a test input circuit and a test vector used for a single second semiconductor integrated device may be used as is. This significantly decreases the test load.

(3) In the present invention, the semiconductor integrated circuit device may further comprise an enable signal generation circuit which generates an enable signal making a state of the first buffer conductive when an output of the first semiconductor integrated circuit is tested and making the state of the first buffer nonconductive when an output of the second semiconductor integrated circuit is tested, and outputs the enable signal as an input to the enable terminal of the first buffer.

The present invention makes it possible to control the conductive and nonconductive state of the first buffer easily using the enable signal generated by the enable signal generation circuit.

(4) In the present invention, the I/O circuit may comprise a current characteristic test circuit testing a current characteristic of the first buffer, the current characteristic test circuit may comprise:

an current-characteristic-test-mode setting terminal TS;

a current-characteristic-test-mode input terminal TA;

a current-characteristic-test-mode enable terminal TE;

a normal mode input terminal A;

a normal mode enable terminal E;

an input signal selection circuit which selects an input from the terminal TA and an input from the terminal A according to an input from the terminal TS; and an enable signal selection circuit which selects an input from the terminal TE and an input from the terminal E according to an input from the terminal TS, a signal line of the internal signal output from the first semiconductor integrated circuit may be connected to the terminal A, and an output of the input signal selection circuit may be connected to an input of the first buffer, and an output of the enable signal selection circuit may be connected to the enable terminal of the first buffer, so that the internal signal is output to outside through the external terminal and is output as an input to the second semiconductor integrated circuit.

In the I/O circuit of the present invention, a signal from the terminal TA is input to the first buffer, and the output of the first buffer is controlled according to the enable signal from the terminal TE in the current-characteristic-test-mode. Accordingly, when the test enable signal input from the terminal TE is made active in a current-characteristic-test-mode, the characteristics of the output current of the first buffer at the "H" level can be inspected by changing a test input signal output from the terminal TA to the "H" level and the characteristics of the output current of the first buffer at the "L" level can be measured by changing a test input signal output from the terminal TA to the "L" level.

Also, a high impedance state is allowed for the first buffer to measure leak current by making the test enable signal from the terminal TE inactive in the current-characteristic-test-mode.

Because the I/O circuit of the present invention includes such a current characteristic test circuit, a current characteristic test can be simply performed.

Connection between chips requires only the I/O circuit of the present invention and aluminum wiring when a plurality of semiconductor integrated circuits are integrated on one chip, by connecting the signal line of the internal signal output from the first semiconductor integrated circuit to the terminal A and by inputting the output from the first buffer to the second semiconductor integrated circuit through the second buffer. This eliminates the necessity for a connection test between chips which is required in the case of a connection using a selector or the like, with the result that the test loads such as test time and the formation of a test vector can be remarkably decreased.

There has been a strong request to integrate a plurality of chips developed by different manufacturers on one chip to form an SOC (system on chip) in recent years. In such a case, it is difficult to prepare a test vector considering the structures of the chips developed by other manufacturers. The present invention ensures an operation by only a test for each single semiconductor integrated circuit and is therefore particularly effective when separately developed semiconductor integrated circuits are integrated on one chip.

It is to be noted that such an I/O circuit including a current characteristic test circuit as that of the present invention is preferably made into a general purpose product. Because the test time and test loads in the current characteristic test and the test for a semiconductor integrated circuit device can be remarkably reduced only by wiring a necessary signal line to each input terminal of the generalized I/O circuit including the current characteristic test circuit which is made into a general purpose product.

(5) The present invention further provides a semiconductor integrated circuit device comprising:

a first semiconductor integrated circuit;

a second semiconductor integrated circuit; and an I/O circuit connected to an external terminal, wherein, when a first internal signal is output to the second semiconductor integrated circuit from the first semiconductor integrated circuit, the I/O circuit outputs the first internal signal to outside through an external terminal and to the second semiconductor integrated circuit as an input thereto, and wherein, when a second internal signal is output to the first semiconductor integrated circuit from the second semiconductor integrated circuit, the I/O circuit outputs the second internal signal to outside through an external terminal and to the first semiconductor integrated circuit as an input thereto.

According to the present invention, even when internal signals are exchanged between plural semiconductor integrated circuits by using a bidirectional signal line such as a data bus, connection between chips requires only an I/O circuit and aluminum wiring, when semiconductor integrated circuits are integrated on one chip. This eliminates the necessity for a connection test between chips which is required in the case of a connection using a selector or the like, with the result that the test loads such as test time and the formation of a test vector can be remarkably decreased.

There has been a strong request to integrate a plurality of chips developed by different manufacturers on one chip to form an SOC (system on chip) in recent years and in such a case, it is difficult to prepare a test vector considering the structures of the chips developed by other manufacturers. The present invention ensures an operation by only a test for each single semiconductor integrated circuit even when internal signals are exchanged between plural semiconductor integrated circuits by using a bidirectional signal line and is therefore particularly effective when separately developed semiconductor integrated circuits are integrated on one chip.

(6) The I/O circuit of the present invention may comprise:

a first buffer having an enable terminal;

a logical sum circuit which outputs a logical sum of a first enable signal for controlling an output of the first internal signal and a second enable signal for controlling an output of the second internal signal, as an input to the enable terminal of the first buffer; and an internal signal selection circuit which selects one of the first internal signal and the second internal signal according to the first enable signal and the second enable signal and outputs the selected one of the first internal signal and the second internal signal as an input to the first buffer, and the first buffer may output at least one of the first internal signal and the second internal signal to outside through the external terminal according to an output from the logical sum circuit and to the first semiconductor integrated circuit or to the second semiconductor integrated circuit as an input thereto.

(7) The present invention still further provides an electronic instrument comprising any one of the aforementioned semiconductor integrated circuit devices; an input means for data to be subjected to processing by the semiconductor integrated circuit device; and an output means for the data processed by the semiconductor integrated circuit device.

This structure makes it possible to decrease the test loads, for instance, in the development of an electronic instrument which outputs given data from an output means corresponding to the input to an input means and hence an electronic instrument with improved cost-efficiency can be provided.

In recent years, many electronic instruments are also being structured by combining CPUs, LCDs and other peripheral devices which are developed by different manufacturers. In such a case, there is a strong requirement to integrate a plurality of chips, such as CPU chips and LCD controller chips, developed by different manufacturers on one chip to form an SOC (system on chip). In such a case, the present invention also ensures an operation by only a test for each single semiconductor integrated circuit and is therefore particularly effective in decreasing the test loads when an electronic instrument is structured by combining CPUs, LCDs and other peripheral devices which are developed by different manufacturers.

(8) The present invention yet further provides a method of testing a semiconductor integrated circuit device, wherein an internal signal from a first semiconductor integrated circuit is input to a second semiconductor integrated circuit through a first buffer of an I/O circuit connected to an external terminal, and wherein a state of the first buffer is made conductive when an output of the first semiconductor integrated circuit is tested and the state of the first buffer is made nonconductive when an input of the second semiconductor integrated circuit is tested.

BRIEF DESCRIPTION OF THE DRAWINGS

FIG. 7 is a truth table of a buffer with a test function.

FIG. 9 is a view for explaining the relationship between an internal signal of a test signal generation circuit and a terminal of a buffer with a test function.

DESCRIPTION OF THE PREFERRED EMBODIMENTS OF THE INVENTION

Preferred embodiments of the present invention will be hereinafter explained with reference to the drawings.

1. First Embodiment

Figure 2:
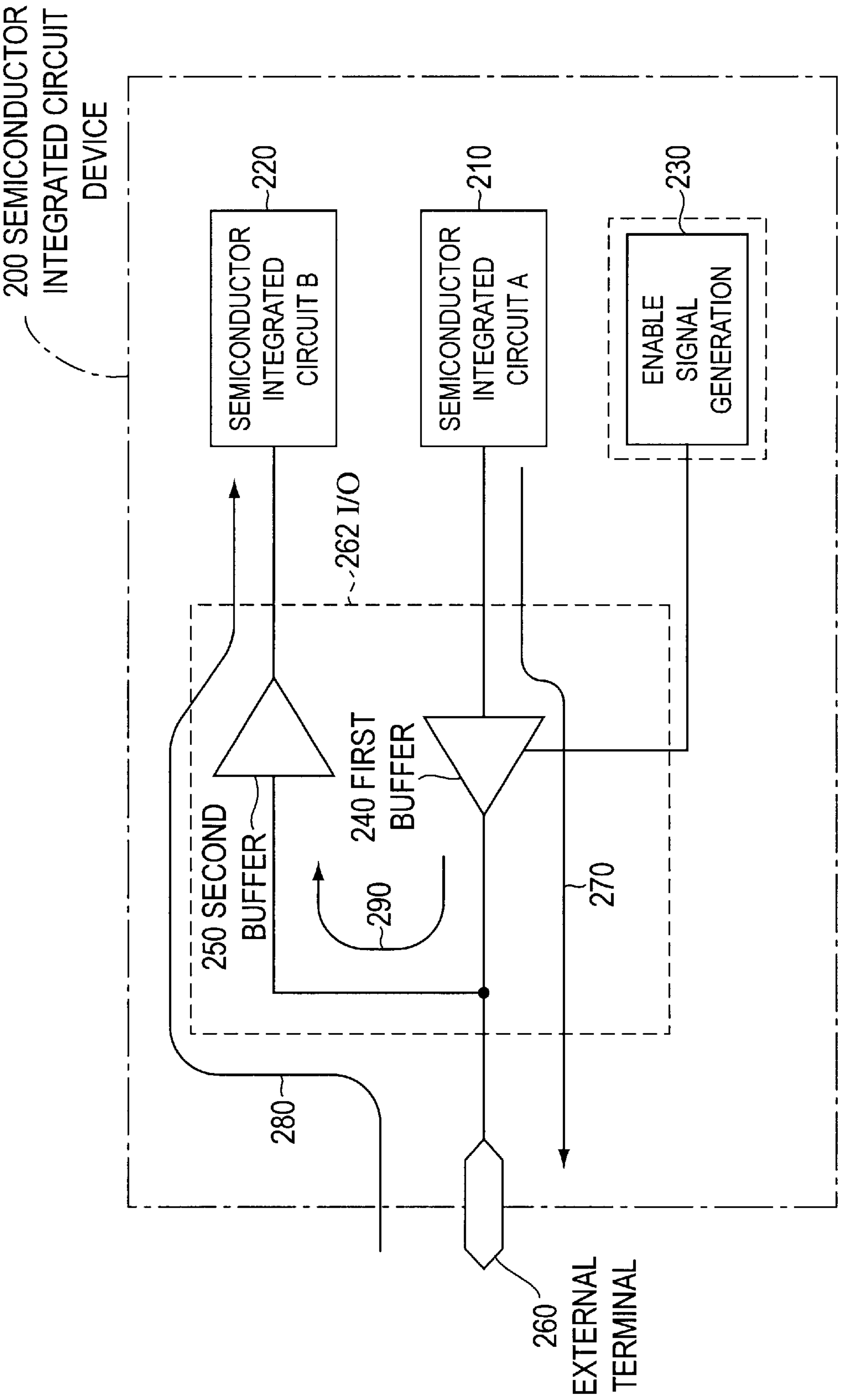
FIG. 2 is a circuit diagram for explaining a first embodiment of the present invention.

FIG. 2 is a circuit diagram for explaining a first embodiment of the present invention.

The first embodiment possesses a characteristic whereby an internal signal to be output from a semiconductor integrated circuit A (210) is input to a semiconductor integrated circuit B (220) through an I/O circuit 262.

210 and 220 respectively represent semiconductor integrated circuits A and B to be integrated on a one chip semiconductor integrated circuit device 200. 260 represents an external terminal (PAD) of the semiconductor integrated circuit device 200. The I/O circuit 262 is connected to the external terminal 260. The I/O circuit 262 comprises a first buffer 240 and a second buffer 250.

The first buffer 240 is connected to the output of the semiconductor integrated circuit A and is made conductive or nonconductive according to an enable signal generated by an enable signal generation circuit 230. The output of the second buffer 250 is connected to the semiconductor integrated circuit B (220). Therefore, when the first buffer is made conductive, an internal signal which is the output of the semiconductor integrated circuit A (210) is output to outside via the external terminal 260 (see 270) and also input to the semiconductor integrated circuit device B (220) via the second buffer 250 (see 290).

Also when the first buffer is made nonconductive, an external input may be input to the semiconductor integrated circuit device 220 via the external terminal 260 (see 280).

When an enable signal of H level is output by the enable signal generation circuit 230 during normal operation and testing of the output of the semiconductor integrated circuit A (210), the first buffer 240 is in the conductive state and hence the internal signal which is the output of the semiconductor integrated circuit A (210) is output to outside via the external terminal 260 (see 270) and also input to the semiconductor integrated circuit device B (220) via the second buffer 250 resultantly (see 290).

When an enable signal of L level is output by the enable signal generation circuit 230 during testing of the input of the semiconductor integrated circuit B (220), an external input can be input to the second semiconductor integrated circuit 220 via the external terminal 260 since the first buffer 240 is in the nonconductive state (see 280).

In the first embodiment, in the same manner, the internal signal of the semiconductor integrated circuit A is output to outside via the external terminal 260, therefore a simple test can indicate whether or not the internal signal of the semiconductor integrated circuit A is output exactly.

Also because an internal signal to be the input to the semiconductor integrated circuit B can be input from the external terminal 260, a test for the input of the semiconductor integrated circuit device B can be performed without causing the semiconductor integrated circuit A to produce an internal signal. It is therefore also possible to lighten the burden required to form a test vector.

According to the first embodiment, the formation of a test vector for each single test for the semiconductor integrated circuits A and B, and the verification of the test results, can be attained with ease.

Figure 1:
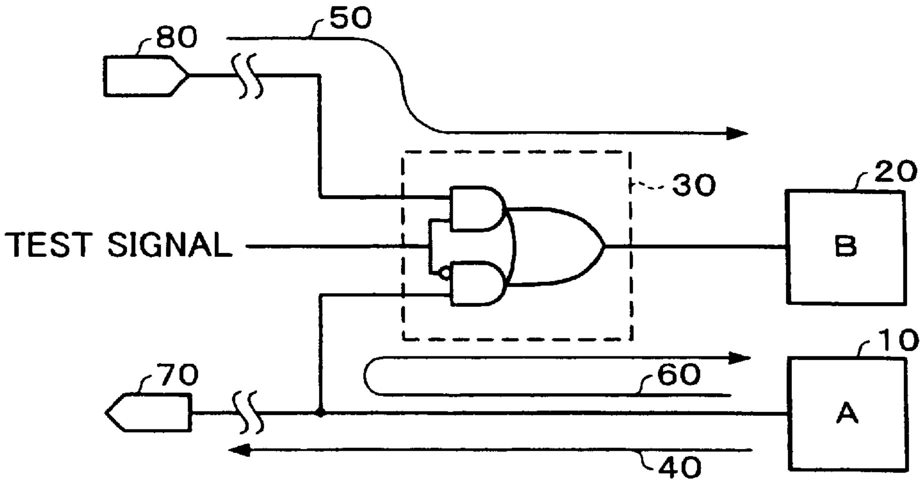
FIG. 1 is a view for explaining measures for making an interface between two chips, A and B.

Also, as shown in FIG. 1, when the semiconductor integrated circuit devices A and B are connected via a selection circuit 30, a connection test for the selection circuit 30 must be made. However, in this embodiment, no element exists but only aluminum wiring is formed between the first buffer 240 and the second buffer 250. It is therefore unnecessary to carry out a particular connection test, which decreases test time and test loads.

2. Second Embodiment

Next, a second embodiment concerned with the case where an internal signal is allowed to pass through a bidirectional signal line such as a data bus will be explained.

Figure 3A:
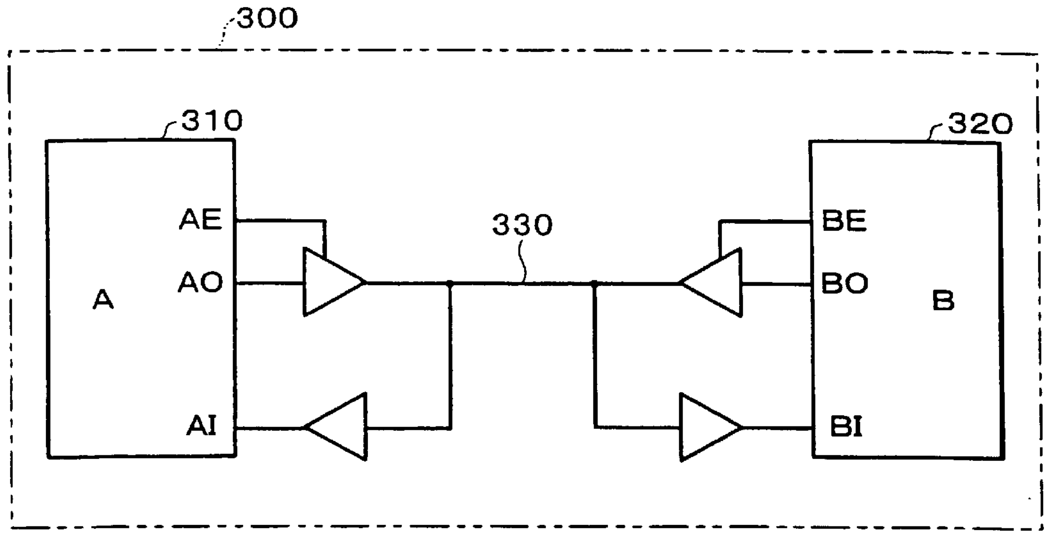
FIG. 3A and 3B are views for explaining the characteristics of the a second embodiment.
Figure 3B:
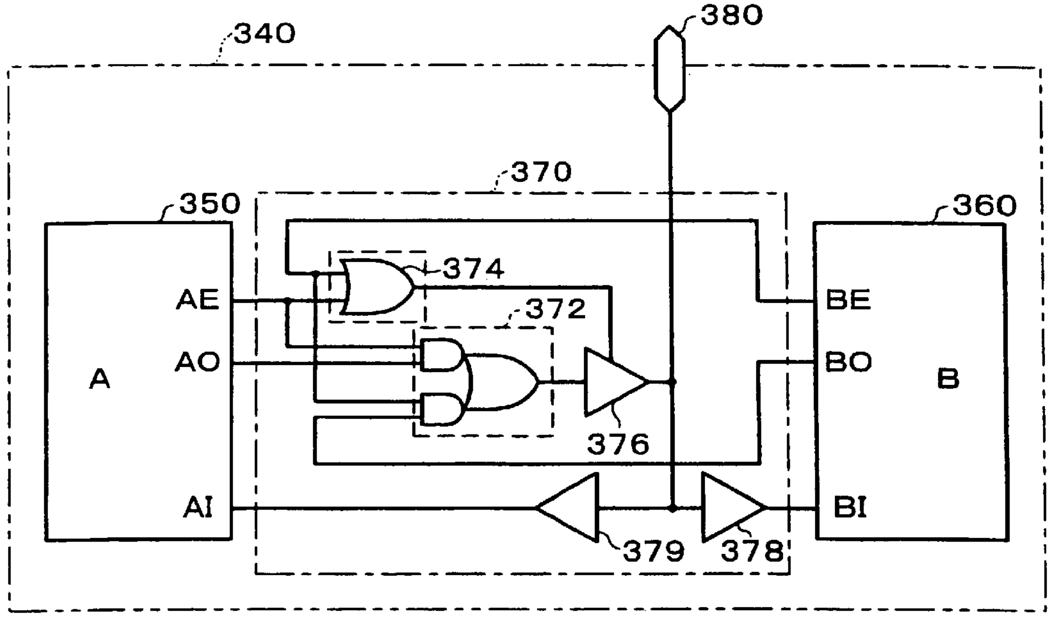

FIGS. 3A and 3B are views for explaining the characteristics of the second embodiment.

FIG. 3A is a simple circuit diagram in the case of exchanging an internal signal between semiconductor integrated circuits A and B integrated on a semiconductor integrated circuit device 300 via a bidirectional signal line 330 such as a data bus.

FIG. 3B shows an example of a circuit diagram of a portion showing the characteristic of a semiconductor integrated circuit device 340 of the second embodiment. When an internal signal is bidirectional, the inputs (AI and BI), outputs (AO and BO) and enable signals (AE and BE) of the semiconductor integrated circuits A and B are connected to a bidirectional signal I/O circuit 370 as shown in the figure.

374 represents a logical sum circuit of the enable signals of the semiconductor integrated circuits A and B (350 and 360) and 372 represents a selection circuit for selecting the output signal of the semiconductor integrated circuit A or B. The I/O circuit 370 selects an internal signal output from the semiconductor integrated circuit A or B (350 or 360) according to an enable signal output from the semiconductor integrated circuit A or B (350 or 360) to output the selected internal signal to outside via an external signal 380 and also as the inputs to the semiconductor integrated circuits A and B (350 and 360).

For instance, when an internal signal is output from AO of the semiconductor integrated circuit A (350), an enable signal of H level is output from AE, and also an enable signal of L level is output from BE of the semiconductor integrated circuit B (360). Therefore, the internal signal output from AO is selected in the output signal selection circuit 372. Also, a buffer 376 is made conductive according to the enable signal of the H level output from AE, and the internal signal output from AO is output to outside via the external terminal 380 and also input to BI of the semiconductor integrated circuit B via a buffer 378. In this case, because the internal signal of the semiconductor integrated circuit A (350) is output from the external terminal 380, a test for the output of the internal signal of the semiconductor integrated circuit A (350) can be made.

When an internal signal is output from BO of the semiconductor integrated circuit B (360), an enable signal of H level is output from BE, and also an enable signal of L level is output from AE of the semiconductor integrated circuit A (350). Therefore, the internal signal output from BO is selected in the output signal selection circuit 372. Also, the buffer 376 is made conductive according to the enable signal of the H level output from BE, and the internal signal output from BO is output to outside via the external terminal 380 and also input to AI of the semiconductor integrated circuit A via a buffer 379. In this case, because the internal signal of the semiconductor integrated circuit B (360) is output from the external terminal 380, a test for the output of the internal signal of the semiconductor integrated circuit B (360) can be made.

If an L level enable signal is output from AE and BE when it is intended to input a test signal to AI of the semiconductor integrated circuit A (350) or BI of the semiconductor integrated circuit B (360), the buffer 376 is made nonconductive. Therefore the test signal from the external signal 380 can be input to AI of the semiconductor integrated circuit A (350) or BI of the semiconductor integrated circuit B (360).

By this means, the test loads of the semiconductor integrated circuit device can be decreased even in a bidirectional signal line such as a data bus.

Figure 4:
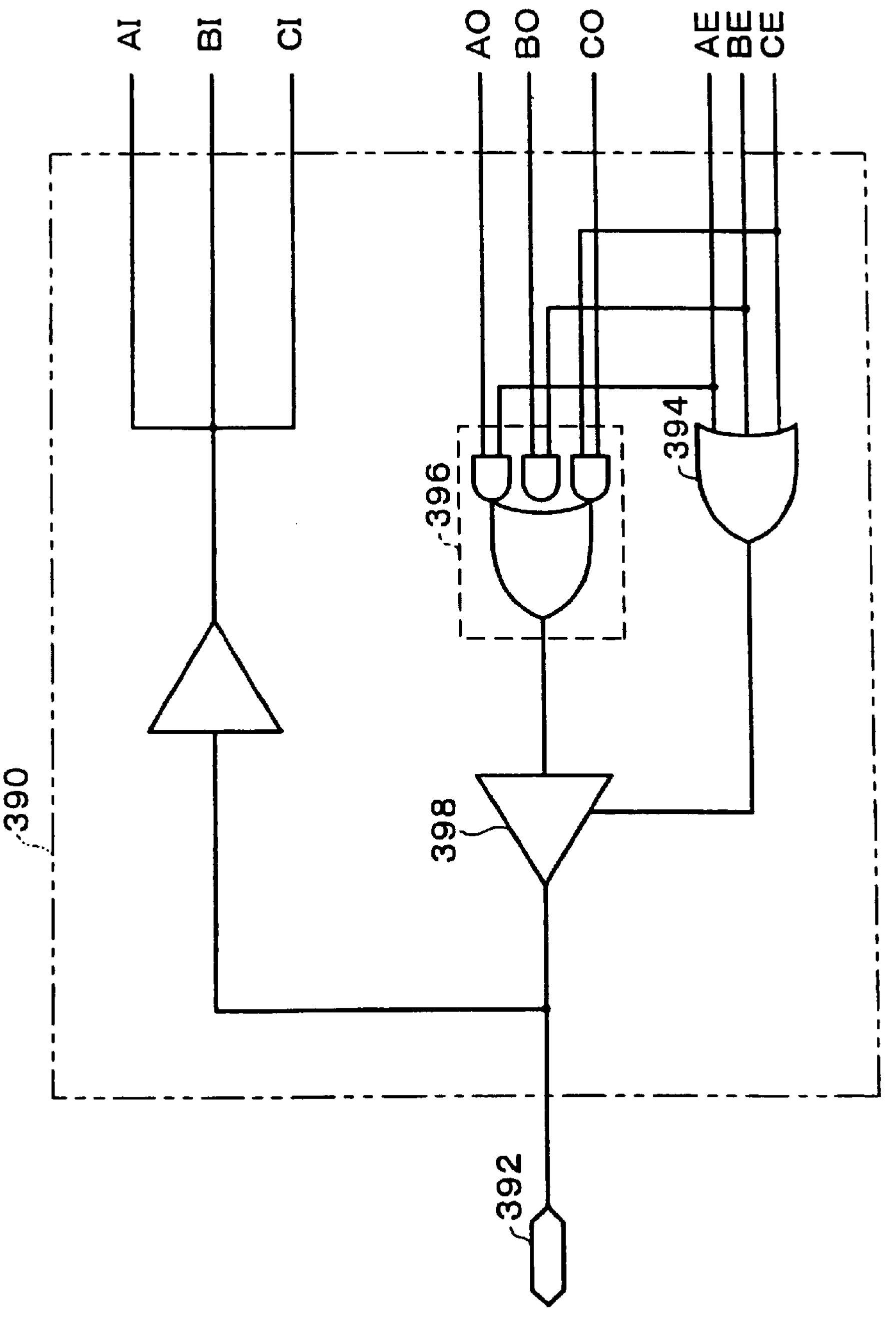
FIG. 4 is a view for explaining an example to which the present invention is applied in the case where the input and output of an internal signal exchanged between semiconductor integrated circuits A, B and C are connected to a bidirectional data bus.

FIG. 4 is a view for explaining an example to which the present invention is applied in the case where the input and output of an internal signal exchanged between semiconductor integrated circuits A, B and C are connected to a bidirectional data bus.

(AI, BI and CI) are connected to each input terminal of the semiconductor integrated circuits A, B and C, (AO, BO and CO) are connected to each output terminal of the semiconductor integrated circuits A, B and C, and (AE, BE and CE) are connected to each enable signal output terminal of the semiconductor integrated circuits A, B and C.

394 represents a logical sum circuit of enable signals of the semiconductor integrated circuits A, B and C, and 396 represents a selection circuit for selecting the output signal of the semiconductor integrated circuit A, B or C. The selection circuit 396 selects each internal signal output from the semiconductor integrated circuits A, B and C according to each enable signal output from the semiconductor integrated circuits A, B and C and outputs the selected signal as the input to the buffer 398. The buffer 398 is made conductive or nonconductive according to the output from the logical sum circuit 394 of the enable signal. When the enable signal output from any one of the semiconductor integrated circuits A, B and C is active, the internal signal output from the corresponding semiconductor integrated circuit is selected and output to outside via the external terminal 392 and also as the input of the semiconductor integrated circuit A, B or C.

By this means, the present invention may be applied even in the case of using an internal signal exchanged between three or more semiconductor integrated circuits by a bidirectional signal line such as a data bus.

3. Third Embodiment

Next, a third embodiment, using a buffer with a test function to which the present invention is applied, will be explained.

Figure 5:
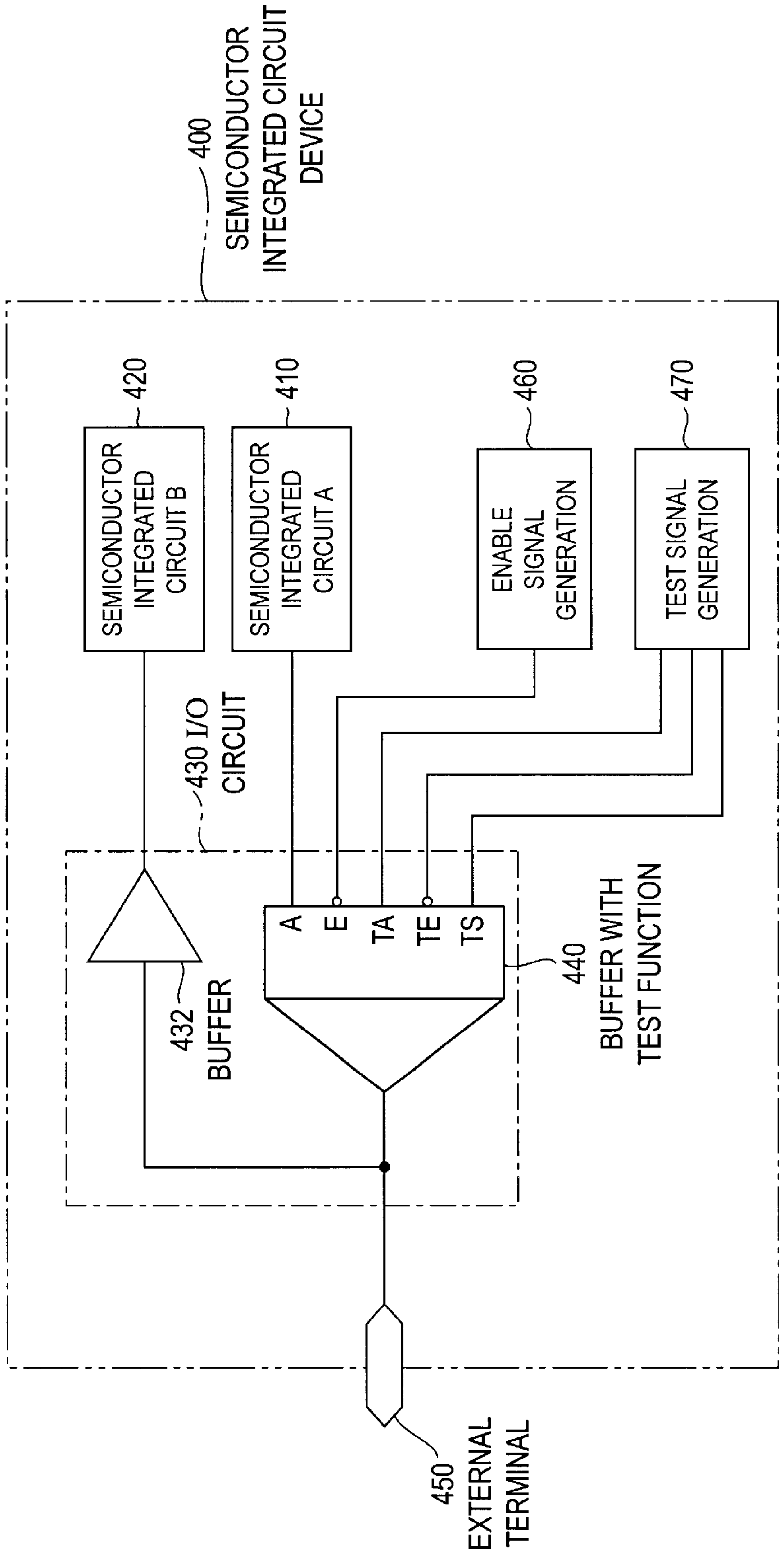
FIG. 5 is a view for explaining the characteristic of a third embodiment of the present invention.

FIG. 5 is a circuit diagram for explaining the characteristic of the third embodiment.

The third embodiment has a characteristic whereby an input signal from a semiconductor integrated circuit A (410)

is input to a semiconductor integrated circuit B (420) through an I/O circuit 430 including a buffer 440 with a test function.

410 and 420 respectively represent semiconductor integrated circuits A and B integrated on a one chip semiconductor integrated circuit device 400. 450 represents an external terminal (PAD) of the semiconductor integrated circuit device 400. The I/O circuit 430 is connected to the external terminal 450. The I/O circuit 430 comprises a buffer 440 with a test function and a buffer 432.

An A terminal of the buffer with a test function is connected to the output of the semiconductor integrated circuit A (410) and an E terminal is connected to the output of an enable signal generation circuit 460. A TA terminal, a TE terminal and a TS terminal are connected to each output of a test signal generation circuit 470.

The output of the buffer 440 with a test function is output to the outside of the semiconductor integrated circuit device 400 via the external terminal (PAD) 450 and also input to the semiconductor integrated circuit B (420) via the buffer 432.

Here, the buffer 440 with a test function will be explained. The buffer with a test function is an I/O circuit provided with a test function of providing a DC test and an AC test in an efficient manner. The DC test is a test made to measure whether or not input /output terminals fulfill the requirements concerning current characteristics, and the AC test is a test for measuring signal speed from an input pin to an output pin.

Figure 6:
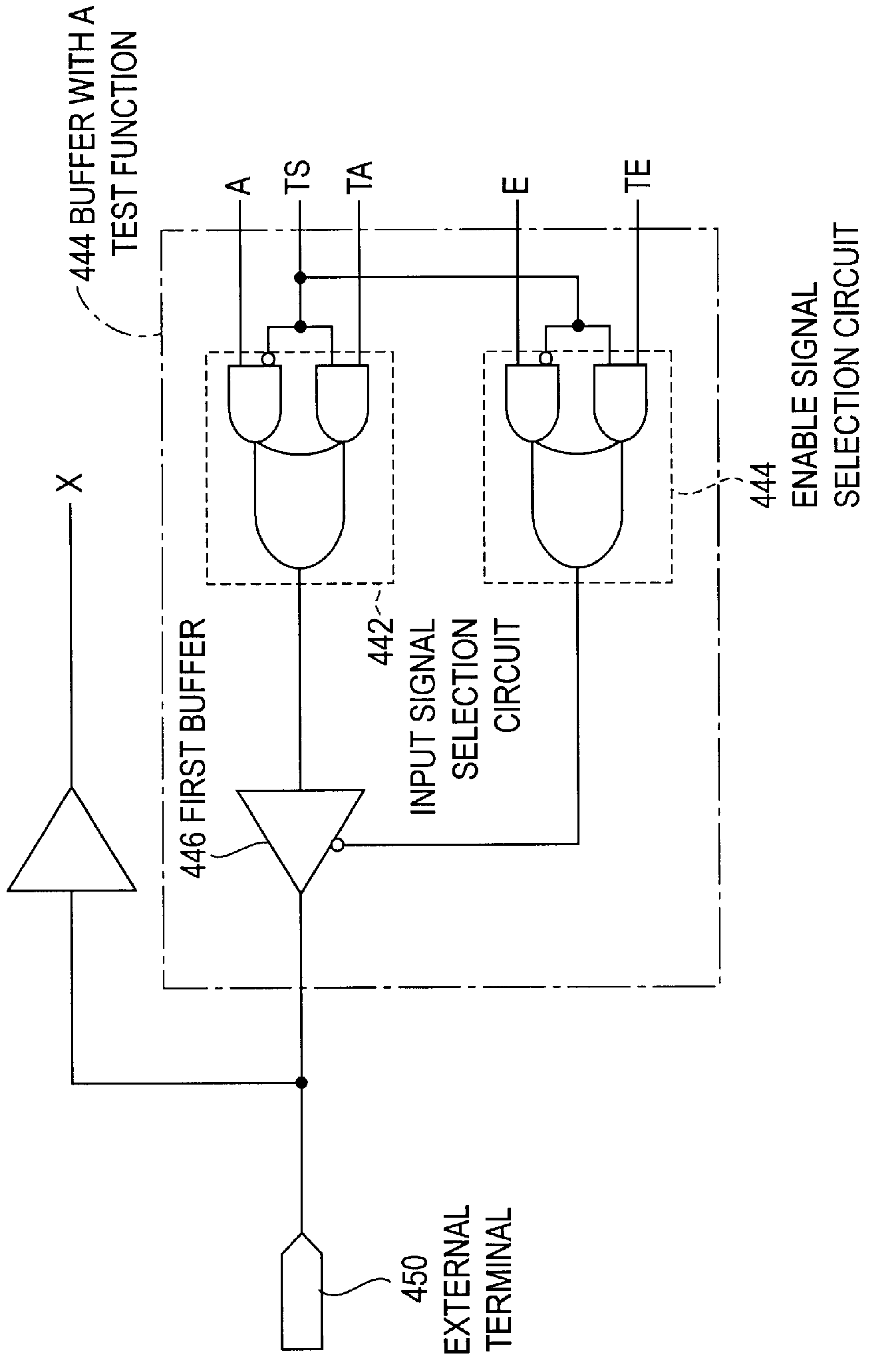
FIG. 6 is an example of an internal circuit of a buffer with a test function.

FIG. 6 is an example of an internal circuit diagram of the buffer with a test function. FIG. 7 is a truth table for the input/output of the buffer with a test function.

The buffer 440 with a test function is provided with five input pins represented by A, E, TA, TE and TS. TS is a current-characteristic-test-mode setting terminal, TA is an input terminal for current-characteristic-test-mode, TE is an enable terminal for current-characteristic-test-mode, A is an input terminal for normal mode and E is an enable terminal for normal mode. When TS=1, a current-characteristic-test-mode is set (see 540 in FIG. 7) and when TS=0, a normal mode is set (see 530 in FIG. 7).

As shown in FIG. 6, the buffer 440 with a test function comprises an input signal selection circuit 442 which selects the input supplied from the terminal TA or the input supplied from the terminal A according to the input of the terminal TS, and an enable signal selection circuit 444 which selects the input supplied from the terminal TE or the input supplied from the terminal E according to the input of the terminal TS. The output of the input signal selection circuit 442 is connected to the input of the first buffer 446 and the output of the enable signal selection circuit 444 is connected to the enable terminal of the first buffer 446.

For instance, the reproduction of a test mode indicated by 542 shown in FIG. 7 makes it possible to measure leak current of the external terminal 450 connected to the first buffer 446. The reproduction of a test mode indicated by 544 shown in FIG. 7 makes it possible to measure the output current of the L level of the external terminal 450 connected to the first buffer 446. The reproduction of a test mode indicated by 546 makes it possible to measure the output current of the H level of the external terminal 450 connected to the first buffer 446.

Figure 8:
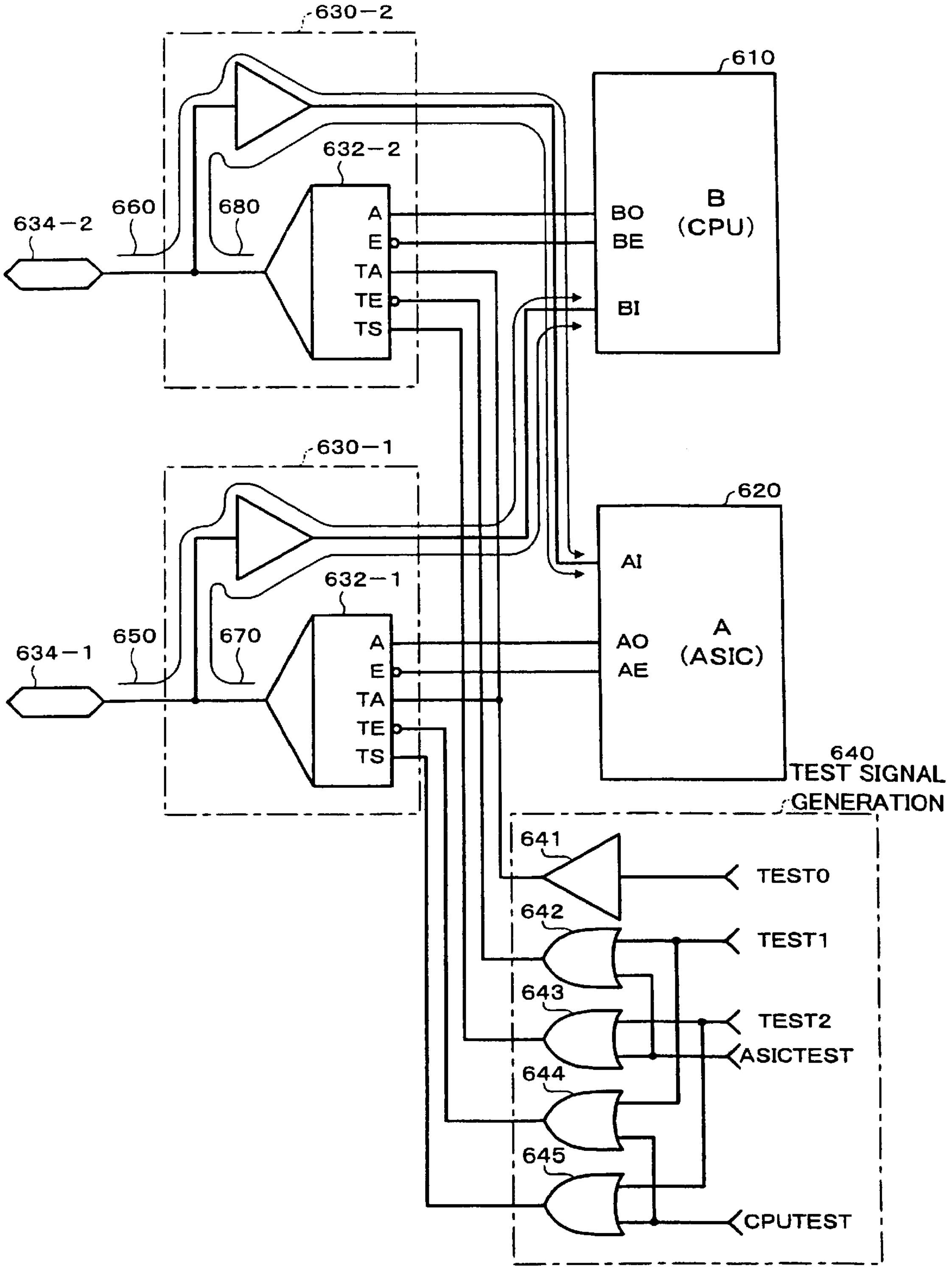
FIG. 8 is an example of a circuit diagram of the third embodiment of the present invention.

FIG. 8 is a view showing an example of a circuit diagram of a third embodiment of the present invention.

The outputs (AO and BO) and enable signals (AE and BE) of the semiconductor integrated circuits A and B are connected to A and E terminals of buffers (632-1, 632-2) with a test function respectively.

The outputs of the buffers (632-1 and 632-2) with a test function are connected to external terminals (634-1 and 634-2) and also to the inputs (AI and BI) of the semiconductor integrated circuits A and B respectively as shown in FIG. 8.

TA terminal, TE terminal, and TS terminal of the buffers (632-1, 632-2) with a test function are connected to the respective test signal generation circuits 640.

The test signal generation circuit 640 generates a test signal and a signal for a DC test for the semiconductor integrated circuits A and B according to internal signals CPUTEST, ASICTE, TEST0, TEST1 and TEST2.

CPUTEST is a signal for assigning the test mode of the semiconductor integrated circuit A (CPU), ASICTEST is a signal for assigning the test mode of the semiconductor integrated circuit B (ASIC) and TEST 2 is a signal for assigning the DC test mode. Each signal becomes active at the H level. TEST0 is output data for a DC test and TEST1 is an output enable for a DC test.

In the third embodiment, the DC test, communication between the semiconductor integrated circuits A and B, and each test of the semiconductor integrated circuits A and B can be attained simply by using the buffers (632-1 and 632-2) with a test function.

FIG. 9 is a view for explaining the relationship between an internal signal of the test signal generation circuit and a terminal of the buffer with a test function.

First, a typical operation of the DC test will be explained. During the DC test, CPUTEST and ASICTEST are held at the L level and TEST 2 is held at the H level.

Here, in the case of measuring high-level output current flowing to the external terminal, TEST0 is held at the H level and TEST1 is held at the L level. By this operation, the output of 641 is changed to the H level, the output of 642 to the L level, the output of 643 to the H level, the output of 644 to the L level, and the output of 645 to the H level(see FIG. 8). Hence each TA terminal of the buffers (632-1, 632-2) is changed to the H level, each TE terminal to the L level and each TS terminal to the H level. Therefore, because as shown by 710 in FIG. 9, the output (PAD) is changed to the H level, the H level output current of the external terminals (634-1, 634-2) can be measured (see 710 in FIG. 9).

When low level output current flowing to the external terminal is measured, TEST0 is held at the L level and TEST1 is held at the L level. By this operation, the output of 641 is changed to the L level, the output of 642 to the L level, the output of 643 to the H level, the output of 644 to the L level and the output of 645 to the H level (see FIG. 8). Hence each TA terminal of the buffers (632-1, 632-2) is changed to the L level, each TE terminal to the L level and each TS terminal to the H level. Therefore, as shown by 720 in FIG. 9, the output (PAD) is changed to the L level, and the L level output current of the external terminals (634-1, 634-2) can be measured.

When leak current to the external terminal is measured, TEST1 is held at the H level. By this operation, the output of 642 is changed to the H level, the output of 643 to the H level, the output of 644 to the H level and the output of 645 to the H level (see FIG. 8). Hence each TE terminal of the buffers (632-1, 632-2) is changed to the H level and each TS terminal to the H level. Therefore, as shown by 730 in FIG. 9, the output (PAD) is in the HZ (high impedance) state, and the leak current of the external terminals (634-1, 634-2) can be measured.

Next, a typical operation of a test of the semiconductor integrated circuit B (ASIC) will be explained. During the CPU test, CPUTEST is held at the H level and ASICTEST and TEST 2 are held at the L level.

By this operation, the output of 644 is changed to the H level and the output of 645 to the H level. Hence the TS terminal of the buffer (632-1) is changed to the H level, the TE terminal to the H level and (see FIG. 8), as shown by 740 in FIG. 9, the output (PAD) is in the HZ state (high impedance). An internal signal from the semiconductor integrated circuit A (CPU) to the semiconductor integrated circuit B (ASIC) is therefore in a nonconductive state resultantly and a test external input from outside can be input to the BI terminal of the semiconductor integrated circuit B (ASIC) (see 650 in FIG. 8) when the semiconductor integrated circuit B is tested.

Accordingly, the signal to be input originally as the internal signal to the semiconductor integrated circuit B (ASIC) can be input as the external signal to the semiconductor integrated circuit B (ASIC).

Also, the output BO of the semiconductor integrated circuit B (ASIC) is eventually output to the external terminal 634-2 as explained below. Specifically, because the output of 643 is held at the L level, the TS terminal of the buffer (632-2) with a test function is changed to the L level and the state (see Note 1 in FIG. 9) of the output (PAD) depends upon the output BO to be input to the A terminal and upon the output BE to be input to the E terminal resultantly. When the output BO of the semiconductor integrated circuit B (ASIC) is output, the output BE is held at the L level and the output BO is in the output (PAD) state and is output to the external terminal 634-2. The result of the operation of the input from the external terminal 634-1 therefore can be verified by the output of the external terminal 634-2.

By holding CPUTEST at the H level in this manner, the formation, implementation, and verification of a test vector for a test of the single semiconductor integrated circuit B (ASIC) can be attained with ease.

Next, a typical operation of a test for the semiconductor integrated circuit A (CPU) will be explained. During the ASIC test, ASICTEST is held at the H level and CPUTEST and TEST 2 are held at the L level.

By this operation, the output of 642 is changed to the H level and the output of 643 to the H level. Hence, the TS terminal of the buffer (632-2) with a test function is changed to the H level, the TE terminal to the H level and (see FIG. 8), as shown by 750 in FIG. 9, the output (PAD) is in the HZ state (high impedance). An internal signal from the semiconductor integrated circuit B (ASIC) to the semiconductor integrated circuit A (CPU) is in the nonconductive state resultantly and a test external input from outside can be input to the AI terminal of the semiconductor integrated circuit A (CPU) (see 660 in FIG. 8).

Accordingly, the signal to be input originally as the internal signal to the semiconductor integrated circuit A (CPU) can be input to the semiconductor integrated circuit A (CPU) from outside.

Also, the output AO of the semiconductor integrated circuit A (CPU) is eventually output to the external terminal 634-1 as explained below. Specifically, because the output of 645 is held at the L level, the TS terminal of the buffer (632-1) with a test function is changed to the L level (see FIG. 8) and the state (see Note 2 in FIG. 9) of the output (PAD) depends upon the output AO to be input to the A terminal and upon the output AE to be input the E terminal resultantly. When the output AO of the semiconductor integrated circuit A (CPU) is output, the output AE is held at the L level and the output AO is in the output (PAD) state and is output to the external terminal 634-1. The result of the operation of the input from the external terminal 634-2 can therefore be verified by the output of the external terminal 634-1.

By holding ASICTEST at the H level in this manner, the formation, implementation, and verification of a test vector for a test of the single semiconductor integrated circuit A (CPU) can be attained with ease.

Next, a typical operation during a normal operation will be explained. Here, during the normal operation, CPUTEST, ASICTEST and TEST2 are held at the L level.

Because by this operation, each output of 643 and 645 is changed to the L level, the TS terminal of the buffers (632-1, 632-2) with a test function is changed to the level (see FIG. 8), the state of the output (PAD) (see Notes 1 and 2) of the buffers (632-1, 632-2) with a test function depends upon the outputs AO and BO to be input to the A terminal and upon the outputs AE and BE to be input to the E terminal (see 760 in FIG. 9).

When the output AO of the semiconductor integrated circuit A (CPU) is output, the output AE is held at the L level and the output AO is changed to the output (PAD) state. The output AO is output to the external terminal 634-1 and also input to the BI terminal of the semiconductor integrated circuit B (ASIC) (see 670 in FIG. 8).

When the output BO of the semiconductor integrated circuit B (ASIC) is output, the output BE is held at the L level and the output BO is changed to the output (PAD) state. The output BO is output to the external terminal 634-2 and also input to the AI terminal of the semiconductor integrated circuit A (CPU) (see 680 in FIG. 8).

During the normal operation, in this manner, an internal signal is exchanged between the semiconductor integrated circuits A and B via the buffers (632-1, 632-2) with a test function.

4. Semiconductor Integrated Circuit Device

Figure 10:
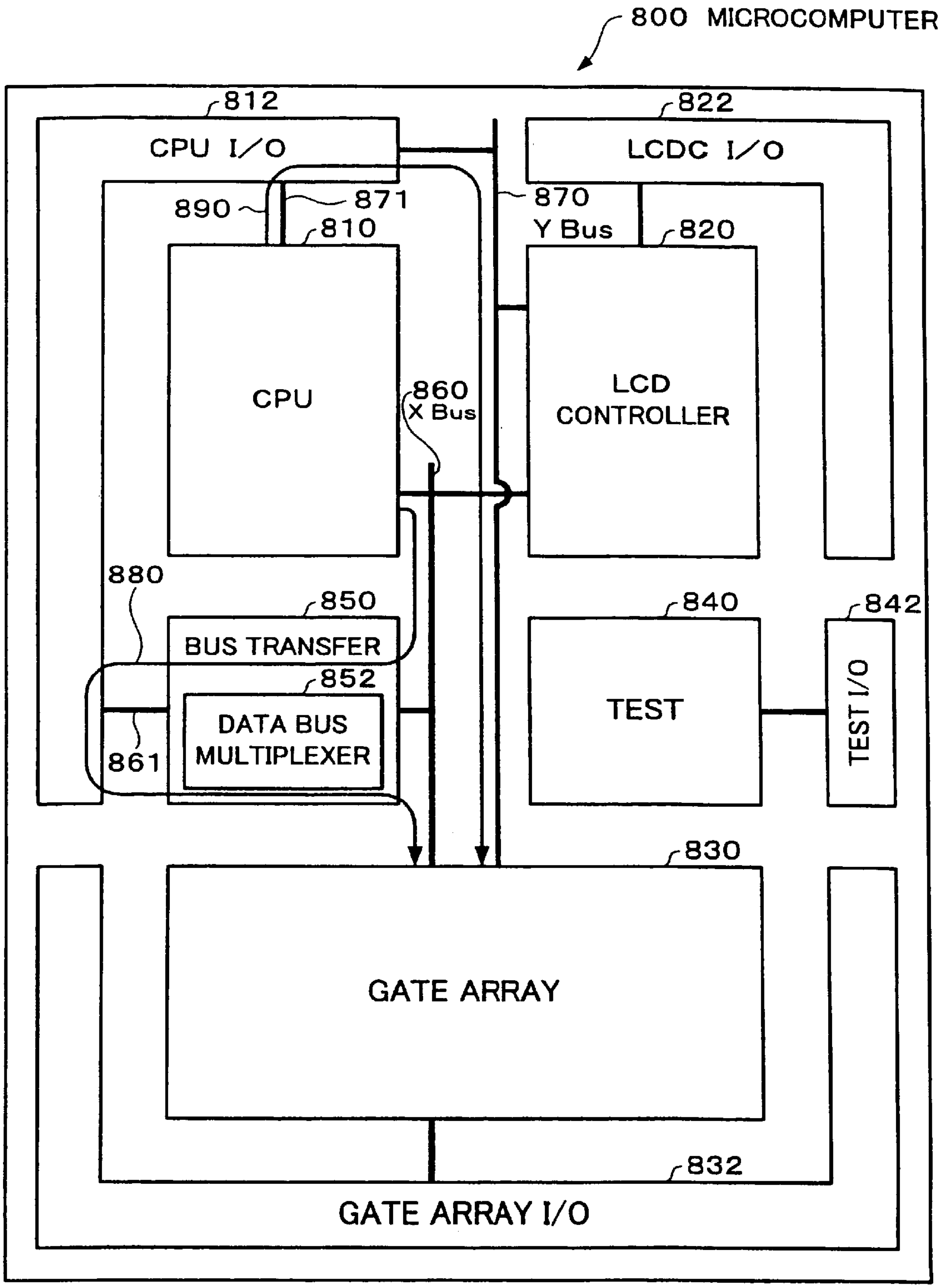
FIG. 10 is a block diagram of a microcomputer as an example of a semiconductor integrated circuit device of the embodiments of the present invention.

FIG. 10 shows a block diagram of a microcomputer 800 which is an example of the semiconductor integrated circuit device of the embodiments of the present invention. This microcomputer 800 is a microcomputer in which a semiconductor integrated circuit 810 having an CPU function, a semiconductor integrated circuit 820 having an LCD controller function as a peripheral function, and a gate array (semiconductor integrated circuit) 830 having a companion function are integrated on one chip.

The gate array (semiconductor integrated circuit) 830 having a companion function is constituted as a usable gate array region in which users can incorporate the functions corresponding to the purpose of using the microcomputer. Therefore, the peripheral functions and the usable gate array allow an original system on chip to be used in applications using an LCD.

The CPU 810 serves to perform a process of executing various orders, the LCD controller 820 serves to perform a process of generating various signals, the gate array 830 serves to perform various processes incorporated by the usable gate array, and the test circuit 840 is a circuit which generates signals for various tests including the DC test (current characteristic) and tests for the gate array 830, the CPU 810, and the LCD controller 820.

A bus transfer 850 serves to control various types of buses and includes a data bus multiplexer 852. The data bus multiplexer 852 serves to perform a process of selecting a signal from a plurality of signal lines connected to a data bus and is needed in the case of exchanging a signal by using a bidirectional signal line such as a data bus. In FIG. 3B, a case where a data bus multiplexer is disposed as a part of the I/O circuit 370 is explained, and a case where a data bus multiplexer is disposed outside of each I/O circuit (812, 822, 832 and 842) is provided as shown in FIG. 10.

An X bus 860 is a data bus and a Y bus 870 is a bus other than a data bus.

The CPU I/O 812, the LCDC I/O 822, the gate array I/O 832 and the test I/O 842 respectively contain an I/O circuit connected to an external terminal (PAD).

These embodiments have a structure in which an internal signal is exchanged between the semiconductor integrated circuits (810, 820 and 830) via the I/O circuits (912, 822, 832 and 842) each connected to an external terminal (PAD).

First, internal signals exchanged via the X bus (data bus) which is a bidirectional signal line will be explained. In the structure, the internal signal exchanged via the X bus (data bus) 860 is exchanged via a bus transfer 850 connected to the CPU I/O 812 and is output to outside via an external terminal (PAD) of an I/O circuit (not shown) contained in the CPU I/O 812. Also, in the structure, a test internal signal can be input via an external terminal (PAD).

Therefore, during the normal operation and an output test for the CPU 810, the internal signal fed from the CPU 810 to the gate array 830 via the X bus is output once to outside via an external terminal which is connected to the CPU I/O 812 via the bus transfer 850 and the signal line 861, and also input to the gate array 830 (see 880 in FIG. 10).

Also, during an input test for the gate array, a test signal input from outside via the external terminal connected to the CPU I/O 812 is input to the gate array 830 (see 890 in FIG. 10).

Next, an internal signal exchanged via buses other than data bus and via signal lines will be explained. In the structure in the embodiments, an internal signal exchanged via the Y bus 870 which is a bus other than a data bus is exchanged via the CPU I/O 812 and can be output to outside via the external terminal (PAD) of the I/O circuit contained in the CPU I/O 812. Also in the structure, a test internal signal can be input via the external terminal (PAD).

Therefore, during the normal operation and the output test for the CPU 810, the internal signal fed from the CPU 810 to the gate array 830 via the Y bus is input once to the CPU I/O 812 via a signal line 871, is output to outside via an external terminal (not shown), and is also input to the gate array 830 through the Y bus (see 890 in FIG. 10).

Also, during an input test for the gate array, the test signal input from outside via an external terminal connected to the CPU I/O 812 is input to the gate array 830 from Y bus.

5. Electronic Instrument

Figure 11:
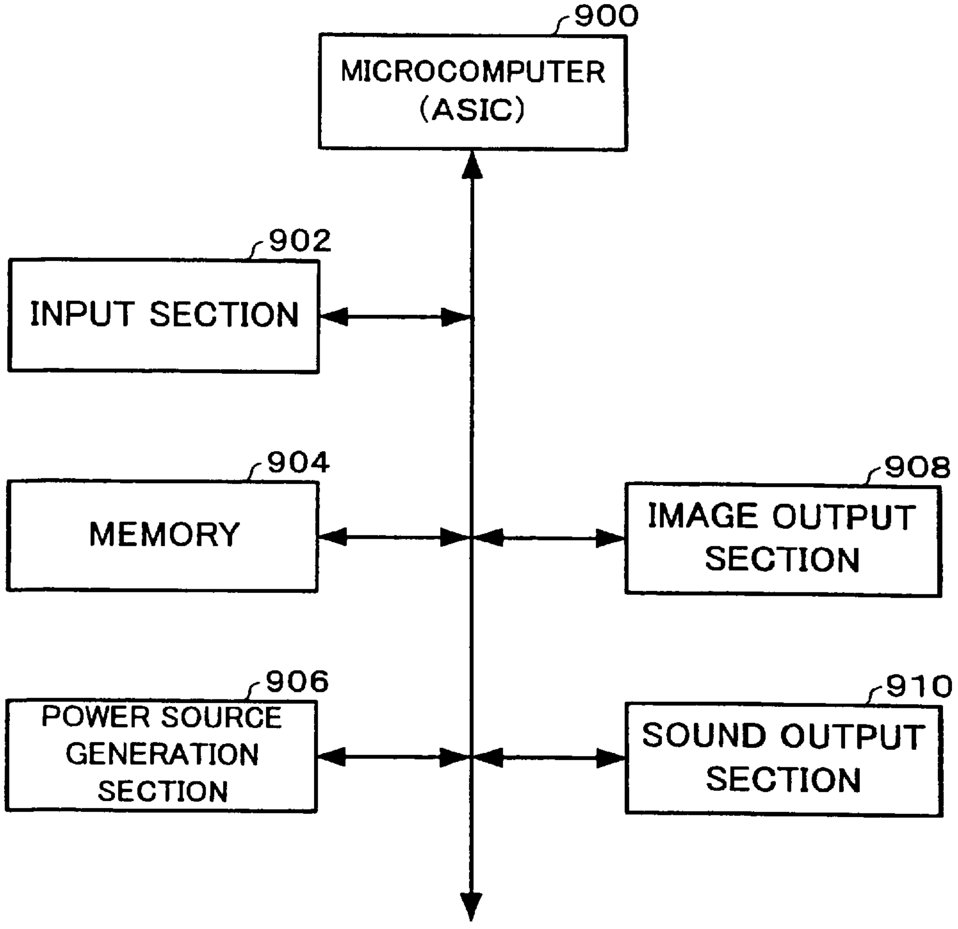
FIG. 11 shows an example of a block diagram of an electronic instrument including a microcomputer.

FIG. 11 shows an example of a block diagram of an electronic instrument including the microcomputer shown in FIG. 10. This electronic instrument comprises a microcomputer 900, an input section 902, a memory 904, a power-generating section 906, an image input section 908, and a sound output section 910.

Here, the input section 902 serves to input various items of data. The microcomputer 900 serves to carry out various treatments on the basis of the data input by the input section 902. The memory 904 serves as a working area for the microcomputer 900 and the like. The power-generating section 906 serves to generate various power sources used in the electronic instrument. The image output section 908 serves to output various types of images (e.g., characters, icons and graphics) which the electronic instrument displays and this function can be attained by hardware such as an LCD and a CRT. The sound output section 910 serves to output various sounds (e.g., voices and game sounds) which the electronic instrument outputs. This function can be attained by hardware such as a speaker.

Figure 12A:
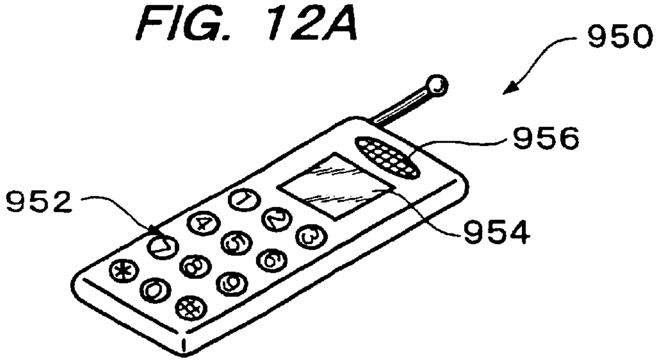
FIGS. 12B and 12C show examples of the outward appearance of various electronic instruments.

FIG. 12A shows an example of the outward appearance of a portable telephone 950 which is one electronic instrument. This portable telephone 950 is provided with a dial button 952 which functions as the input section, an LCD 954 which functions as the image output section and displays a telephone number, names, icons and the like, and a speaker 956 which functions as the sound output section and outputs a voice.

Figure 12B:
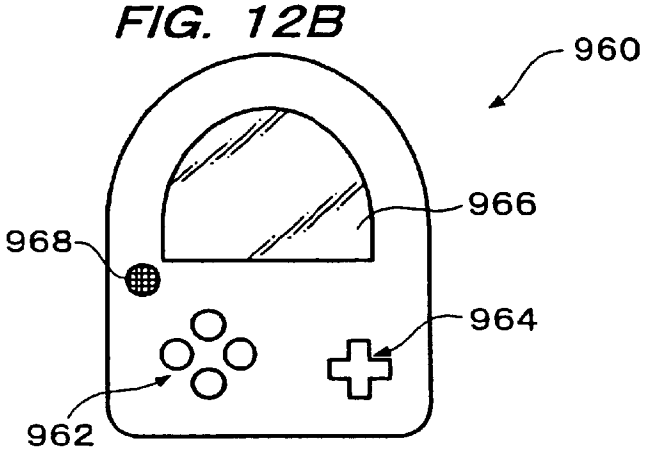

FIG. 12B shows an example of the outward appearance of a portable type game device 960 which is one electronic instrument. This portable type game device 960 is provided with an operation button 962 and a cross key 964 which function as the input section, an LCD 966 which functions as the image output section and displays a game image, and a speaker 968 which functions as the sound output section and outputs a game sound.

Figure 12C:
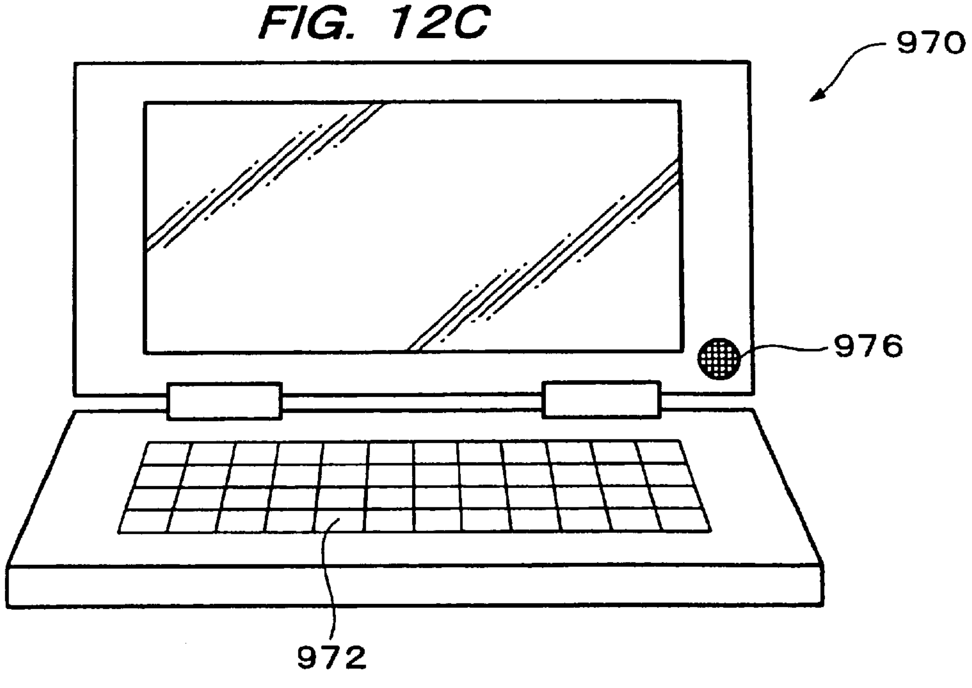

FIG. 12C shows an example of the outward appearance of a personal computer 970 which is another electronic instrument. This personal computer 970 is provided with a key board 972 which functions as the input section, an LCD 974 which functions as the image output section and displays characters, numerals, graphics and the like, and a sound output section 976.

Electronic instruments which show a decrease in test loads and have high cost performance can be obtained by incorporating the microcomputer of FIG. 11, which is the semiconductor integrated circuit device of the present invention, into the electronic instruments shown in FIGS. 12A to 12C.

Electronic instruments which can utilize the embodiments of the present invention are expected to include, other than those shown in FIGS. 12A, 12B and 12C, a variety of electronic instruments such as portable information terminals, pagers, electronic portable calculators, devices provided with a touch panel, projectors, word processors, view finder type or monitor direct viewing type videotape recorders, car navigation devices, and printers.

It is to be noted that the present invention is not limited to the embodiments of the present invention and various modifications may be practiced within the scope of the present invention.

For example, although explanations have been given taking the cases where the buffer 240 of FIG. 2, the buffer 376 of FIG. 3B, and the buffer 398 of FIG. 4 are high active as examples, the present invention is not limited to these cases and the cases where these buffers are low active may be included.

Also, each structure of the ASIC and electronic instruments of the present invention is not limited to those explained with reference to FIGS. 12A to 12C. Various modifications may be practiced.

What is claimed is:

1. A semiconductor integrated circuit device comprising:

a first semiconductor integrated circuit;

a second semiconductor integrated circuit; and an I/O circuit connected to an external terminal, wherein the I/O circuit receives an internal signal, which is sent from the first semiconductor integrated circuit to the second semiconductor integrated circuit, and outputs the internal signal to outside through the external terminal and also as an input to the second semiconductor integrated circuit, wherein the I/O circuit comprises:

a first buffer to which the internal signal is input; and a second buffer connected to a signal line which connects an output of the first buffer to the external terminal, wherein the first buffer includes an enable terminal, and a conductive state and a nonconductive stat of the first buffer are controlled according to an enable signal received by the enable terminal, wherein the second buffer receives at least one of the internal signal and an input signal from the external terminal and outputs the internal signal or the input signal as an input to the second semiconductor integrated circuit, and a current characteristic test circuit testing a current characteristic of the first buffer, wherein the current characteristic test circuit comprises:

an current-characteristic-test-mode setting terminal TS;

a current characteristic-test-mode input terminal TA;

a current-characteristic-test-mode enable terminal TE;

a normal mode input terminal A;

a normal mode enable terminal E;

an input signal selection circuit which selects an input from the terminal TA and an input from the terminal A according to an input from the terminal TS; and an enable signal selection circuit which selects an input from the terminal TE and an input from the terminal E according to an input from the terminal TS, wherein a signal line of the internal signal output from the first semiconductor integrated circuit is connected to the terminal A, and an output of the input signal selection circuit is connected to an input of the first buffer, and wherein an output of the enable signal selection circuit is connected to the enable terminal of the first buffer, so that the internal signal is output to outside through the external terminal and is output as an input to the second semiconductor integrated circuit.

2. An electronic instrument comprising:

the semiconductor integrated circuit device as defined in claim 1;

an input means for data to be subjected to processing by the semiconductor integrated circuit device; and an output means for the data processed by the semiconductor integrated circuit device.

3. A semiconductor integrated circuit device comprising:

a first semiconductor integrated circuit;

a second semiconductor integrated circuit; and an I/O circuit connected to an external terminal, wherein the I/O circuit receives an internal signal, which is sent from the first semiconductor integrated circuit, and outputs the internal signal to outside through the external terminal and also as an input to the second semiconductor integrated circuit, wherein the I/O circuit comprises:

a first buffer to which the internal signal is input; and a second buffer connected to a signal line which connects an output of the first buffer to the external terminal, wherein the first buffer includes an enable terminal, and a conductive state and a nonconductive state of the first buffer are controlled according to an enable signal received by the enable terminal, and wherein the second buffer receives at least one of the internal signal and an input signal from the external terminal and outputs the internal signal or the input signal as an input to the second semiconductor integrated circuit, the semiconductor integrated circuit device further comprising an enable signal generation circuit which generates an enable signal making a state of the first buffer conductive when an output of the first semiconductor integrated circuit is tested and making the state of the first buffer nonconductive when an output of the second semiconductor integrated circuit is tested, and outputs the enable signal as an input to the enable terminal of the first buffer, wherein the I/O circuit comprises a current characteristic test circuit testing a current characteristic of the first buffer, wherein the current characteristic test circuit comprises:

an current-characteristic-test-mode setting terminal TS;

a current-characteristic-test-mode input terminal TA;

a current-characteristic-test-mode enable terminal TE;

a normal mode input terminal A;

a normal mode enable terminal E;

an input signal selection circuit which selects an input from the terminal TA and an input from the terminal A according to an input from the terminal TS; and an enable signal selection circuit which selects an input from the terminal TE and an input from the terminal E according to an input from the terminal TS, wherein a signal line of the internal signal output from the first semiconductor integrated circuit is connected to the terminal A, and an output of the input signal selection circuit is connected to an input of the first buffer, and wherein an output of the enable signal selection circuit is connected to the enable terminal of the first buffer, so that the internal signal is output to outside through the external terminal and is output as an input to the second semiconductor integrated circuit.

4. An electronic instrument comprising:

the semiconductor integrated circuit device as defined in claim 3;

an input means for data to be subjected to processing by the semiconductor integrated circuit device; and an output means for the data processed by the semiconductor integrated circuit device.

* * * * *